United States Patent [19]

Yonenaka

[11] 4,448,465
[45] May 15, 1984

[54] ELECTRICAL CABLE PROTECTOR

[75] Inventor: Thomas H. Yonenaka, San Jose, Calif.

[73] Assignee: Ampex Corporation, Redwood City, Calif.

[21] Appl. No.: 364,730

[22] Filed: Apr. 2, 1982

[51] Int. Cl.³ .............................................. A47B 88/00
[52] U.S. Cl. ................................... 312/223; 312/100; 312/320; 361/338
[58] Field of Search .............. 312/320, 223, 319, 100; 361/338

[56] References Cited

U.S. PATENT DOCUMENTS

| 1,844,572 | 2/1932 | Gourley et al. | 361/338 |
|---|---|---|---|
| 2,145,797 | 1/1939 | Merkel | 361/338 |
| 2,173,101 | 9/1939 | Fiedler | 361/338 |
| 2,486,764 | 11/1949 | Singer | 312/223 |
| 3,088,054 | 4/1963 | Meyer | 361/338 |
| 3,120,411 | 2/1964 | Strumpell | 361/338 |
| 3,356,432 | 12/1967 | Stroud et al. | 312/223 |
| 3,717,319 | 2/1973 | Schultz et al. | 312/320 |
| 3,759,475 | 9/1973 | Brown | 312/320 |

Primary Examiner—Victor N. Sakran
Attorney, Agent, or Firm—J. D. Talcott; C. M. Carman, Jr.

[57] ABSTRACT

A rack-mounted drawer for functioning electrical equipment has cables extending from the back thereof and downwardly behind the rack framework. When the drawer is opened or closed the extending cables are dragged abrasively over the rack back, and may additionally be folded, pinched and crimped between the drawer and rack when the drawer is closed. The invention comprises an apron of resilient coiled sheet material attached to the back of the drawer with the coiled portions draped downwardly and behind the rack, so that upon opening of the drawer, the sheet uncoils over the rack edge and takes the abrasion in place of the cables. The sheet resiliently recoils when the drawer is closed to prevent pinching of the cables.

3 Claims, 3 Drawing Figures

U.S. Patent  May 15, 1984  4,448,465
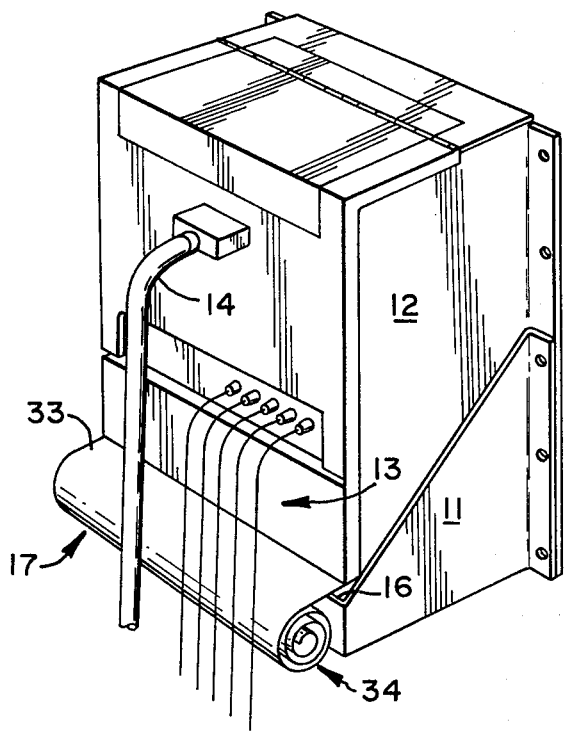
FIG_1
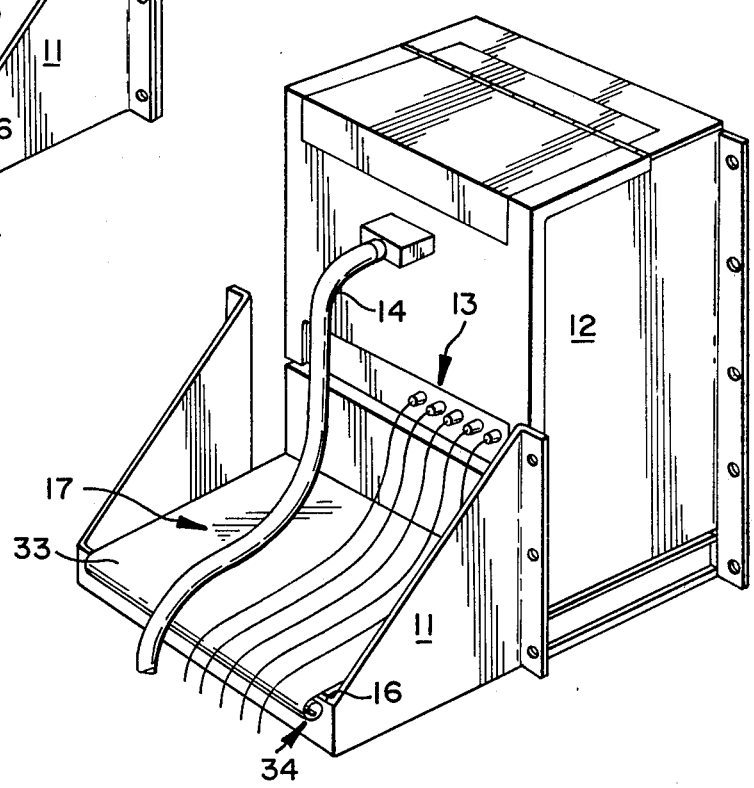
FIG_2
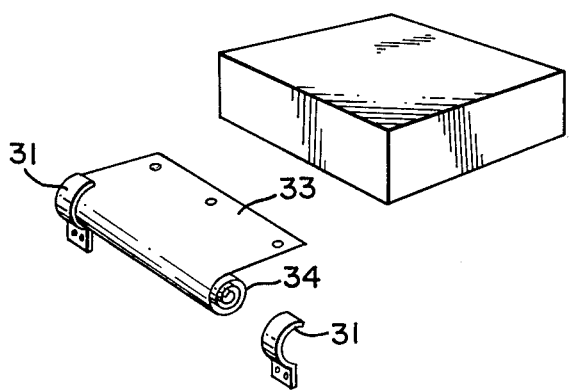
FIG_3

ELECTRICAL CABLE PROTECTOR

This invention relates to rack-mounted drawers for functioning electrical equipment, and particularly to such drawers having cables extending from the rear thereof and downward behind the rack framework.

In the electronic industry it is common practice to mount functioning electrical equipment in rack-mounted drawers, which may be pulled open for access to the equipment, and closed again for compact storage during operation. Usually, functioning electrical cables extend from the back of the drawer and downwardly behind the rack framework, to connect the equipment to power sources or to other equipment.

When the drawer is opened the cables are usually dragged over the rack framework and abrasion of the cable insulation results. When the drawer is closed, further abrasion results, and often one or more of the cables becomes folded between the drawer and rack, resulting in pinching of the cable and perhaps cutting of the insulation. Sooner or later, therefore, the cable becomes unserviceable, sometimes resulting in shorting, grounding, or other catastrophic and health-hazardous phenomena.

Accordingly, it is an object of the present invention to provide a protective guard between a set of drawer mounted electrical equipment cables and the rack framework in which the drawer is mounted.

SUMMARY OF THE INVENTION

A rack-mounted drawer for functioning electrical equipment has cables extending from the back thereof and downwardly behind the rack framework. When the drawer is opened or closed the extending cables are dragged abrasively over the rack back, and may additionally be folded, pinched and crimped between the drawer and rack when the drawer is closed. The invention comprises an apron of resilient coiled sheet material attached to the back of the drawer with the coiled portions draped downwardly and behind the rack, so that upon opening of the drawer, the sheet uncoils over the rack edge and takes the abrasion in place of the cables. The sheet resiliently recoils when the drawer is closed to prevent pinching of the cables.

DESCRIPTION OF THE DRAWINGS

FIG. 1 is a back, side and top perspective view of a rack-mounted drawer for electrical equipment showing the present invention in the closed position of the drawer;

FIG. 2 is a perspective view of the apparatus of FIG. 1, with the drawer in open position; and FIG. 3 is a fragmented perspective view of a variational form of the invention.

DESCRIPTION OF THE PREFERRED EMBODIMENTS

Referring to FIG. 1, there is shown a fixed or stationary rack element 11 mounting a drawer 12 for sliding action (FIG. 2), and a set of electrical cables 13, 14 extending from the back of the drawer and downwardly behind the rack.

When the drawer is opened (FIG. 2), the cables 13, 14 would ordinarily be abraded in passage over the lower back edge 16 of the rack 11.

Accordingly, the present invention comprises an apron 17 of sheet material attached to the bottom back of the drawer 12 below the cables 13, 14 and draped downwardly behind the rack so as to be abraded in place of the cables.

As shown in the FIGURES, the apron 17 may be formed in a coiled form so as to nest against the rack back, and so as not to get in the way of the rack or drawer below.

The coiled apron 17 may also be formed of resilient springy material to induce re-coil action when the drawer is closed, thus to pull the apron back over the back rack edge and to avoid pinching or doubling of the apron and cables.

As shown in FIG. 3 coil guiding and protecting means may be used, in the form of half-round fenders 31 attached to the rack and enclasping the coil.

What is claimed is:

1. Protection apparatus for electrical cables that extend from the back of a drawer when the drawer is sliding between open and closed position with respect to a framework thereof, comprising:

an apron of sheet material secured to said drawer said drawer and said cables when said drawer is opened and closed, said apron extending from said back of said drawer beneath said cables and being draped downwardly between said cables and said framework, so as to remain in frictional contact with said framework during said sliding, thus to avoid abrasion of said cables by said framework upon opening and closing and pinching of said cables between said drawer and framework upon closing of said drawer.

2. Protection apparatus for electricl cables that extend from the back of a drawer when the drawer is sliding between open and closed positions with respect to a framework thereof, comprising;

an apron of sheet material secured by one edge thereof to said drawer beneath said cables and draped downwardly between said cables and said framework, so as to remain in frictional contact with said framework during said sliding, thus to avoid abrasion of said cables by said framework upon opening and closing, and to avoid pinching of said cables between said drawer and framework upon closing of said drawer;

said apron being formed of normally coiled springily resilient material with the outer edge defining said one edge thereof extending horizontally and attached to the back of said drawer, and the coiled body thereof draped below said drawer and behind said framework so as to uncoil upon opening of said drawer and re-coil upon closing thereof.

3. Protection apparatus for electrical cables that extend from the back of a drawer when the drawer is sliding between open and closed positions with respect to a framework thereof, comprising:

an apron of sheet material secured by one edge thereof to said drawer beneath said cables and draped downwardly between said cables and said framework, so as to remain in frictional contact with said framework, during said sliding, thus to avoid abrasion of said cables by said framework upon opening and closing, and to avoid pinching of said cables between said drawer and framework upon closing of said drawer;

said apron being formed of normally coiled springily resilient material with the outer edge defining said one edge thereof extending horizontally and attached to the back of said drawer, and the coiled body thereof draped below said drawer and behind said framework so as to uncoil upon opening of said drawer and re-coil upon closing thereof; and a half-round fender guide and retaining element for said coil, said element being attached to the back of said framework for retaining said coil during opening and closing of said drawer, and for guiding the uncoiling and re-coiling acton of said coil.

* * * * *

UNITED STATES PATENT AND TRADEMARK OFFICE
CERTIFICATE OF CORRECTION

PATENT NO. : 4,448,465
DATED : May 15, 1984
INVENTOR(S) : Thomas H. Yonenaka

It is certified that error appears in the above—identified patent and that said Letters Patent are hereby corrected as shown below:

Column 2, line 21, after "drawer" (first occurrence) insert --for movement with--.

Signed and Sealed this

Twentieth Day of August 1985

[SEAL]

Attest:

DONALD J. QUIGG

Attesting Officer

Acting Commissioner of Patents and Trademarks